(12) United States Patent
Kobayashi

(10) Patent No.: US 7,508,030 B2
(45) Date of Patent: Mar. 24, 2009

(54) SEMICONDUCTOR DEVICE WITH VERTICAL MOSFET AND METHOD OF MANUFACTURING THE SAME

(75) Inventor: Kenya Kobayashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 339 days.

(21) Appl. No.: 11/265,119

(22) Filed: Nov. 3, 2005

(65) Prior Publication Data

US 2006/0091457 A1  May 4, 2006

(30) Foreign Application Priority Data

Nov. 4, 2004  (JP) ............................. 2004-321303

(51) Int. Cl.
*H01L 29/94* (2006.01)
*H01L 21/336* (2006.01)

(52) U.S. Cl. ............................. 257/330; 257/E29.134; 257/E21.419; 438/270

(58) Field of Classification Search ................. 257/213, 257/288, 327, 329, 330, 331, 332, 333, 334, 257/E29.134, E21.418, E21.419; 438/142, 438/197, 268, 270
See application file for complete search history.

(56) References Cited

U.S. PATENT DOCUMENTS

| 5,597,765 A * | 1/1997 | Yilmaz et al. ............... 438/270 |
| 2001/0020712 A1 * | 9/2001 | Raaijmakers et al. ....... 257/301 |
| 2002/0096710 A1 * | 7/2002 | Inagawa et al. ............. 257/330 |
| 2002/0115257 A1 * | 8/2002 | Inagawa et al. ............. 438/270 |

FOREIGN PATENT DOCUMENTS

| JP | 2000-183343 | 6/2000 |
| JP | 2003-515915 | 5/2003 |

* cited by examiner

*Primary Examiner*—Evan Pert
*Assistant Examiner*—Kevin Quinto
(74) *Attorney, Agent, or Firm*—Young & Thompson

(57) ABSTRACT

A semiconductor device includes a base region formed above a semiconductor substrate, a source region formed above the base region, a gate electrode filled inside a trench formed above the semiconductor substrate, an interlayer insulation film formed all over the semiconductor substrate, a first contact hole formed in the interlayer insulation film to expose the gate electrode, a second contact hole formed in the interlayer insulation film and the source region to expose the base region, and a conductive film formed above a trench where the first contact hole is formed.

7 Claims, 6 Drawing Sheets

RELATED ART

SEMICONDUCTOR DEVICE WITH VERTICAL MOSFET AND METHOD OF MANUFACTURING THE SAME

BACKGROUND OF THE INVENTION

1. Field of the Invention

The present invention relates to a semiconductor device and a method of manufacturing the same and, particularly, to a semiconductor device having a vertical metal-oxide-semiconductor field-effect transistor (MOSFET) and a method of manufacturing the same.

2. Description of the Related Art

A power device such as a power MOSFET normally uses a vertical MOSFET. The power MOSFET typically has a trench gate structure where a gate electrode is formed inside a trench. FIG. 6 is a sectional view showing the structure of a conventional power MOSFET. In the MOSFET of FIG. 6, an epitaxial layer 2 is formed all over the surface of a semiconductor substrate 1. A base region 3 and a source region 4 are successively formed on the epitaxial layer 2. A trench 5 penetrates through the source region 4 and the base region 3. A gate oxide film 6 is formed on the inner surface of the trench 5. A gate electrode 7 is formed by depositing polysilicon all over the surface of the semiconductor substrate 1 and etching it back. The polysilicon different from the gate electrode 7 that is deposited inside the trench 5 by the etch-back is then etched away.

In a conventional semiconductor device, an interlayer insulation film 8 is deposited all over the surface of the semiconductor substrate 1. After that, the interlayer insulation film 8 is selectively etched to create contact holes 9 that reach the base region 3 and the gate electrode 7. Then, a conductive plug 10 is formed to fill each contact hole 9. After that, a wiring layer 11 is deposited on the interlayer insulation film 8 and patterned into a source line and a gate line.

The conventional MOSFET forms the source region 4 all over the base region 3 and etches the silicon to the base region 3 when creating the contact hole 9. However, etching the silicon to the base region 3 results in etching the polysilicon of the gate electrode 7 also (see FIG. 6).

A technique that forms the source region on the base region and creates the contact hole that penetrates through the source region is described in Japanese Patent Translation Publication No. 2003-515915.

The polysilicon used for the gate electrode 7 contains a high concentration of impurities in order to reduce resistance and therefore an etching rate is higher than the source region (cf. Japanese Unexamined Patent Publication No. 2000-183343).

The present invention has recognized that the conventional MOSFET has a problem that the gate electrode 7 is etched rapidly and therefore it is etched to the bottom to cause a short-circuit between the gate and drain.

SUMMARY OF THE INVENTION

According to an aspect of the present invention, there is provided a semiconductor device that includes a base region formed above a semiconductor substrate, a source region formed above the base region, a gate electrode filled inside a trench formed above the semiconductor substrate, an interlayer insulation film formed all over the semiconductor substrate, a first contact hole formed in the interlayer insulation film to expose the gate electrode, a second contact hole formed in the interlayer insulation film and the source region to expose the base region, and a conductive film formed above a trench where the first contact hole is formed.

According to another aspect of the present invention, there is provided a method of manufacturing a semiconductor device that includes forming a trench above a semiconductor substrate, filling a gate electrode inside the trench, forming a base region above the semiconductor substrate, forming a source region above the base region, and forming a conductive film above the gate electrode.

Since the second conductive film is formed above the gate electrode, the gate electrode is not etched when etching the source region to the base region. It is thereby possible to prevent a short-circuit between gate and drain due to etching of the gate electrode.

BRIEF DESCRIPTION OF THE DRAWINGS

The above and other objects, advantages and features of the present invention will be more apparent from the following description taken in conjunction with the accompanying drawings, in which.

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1A:
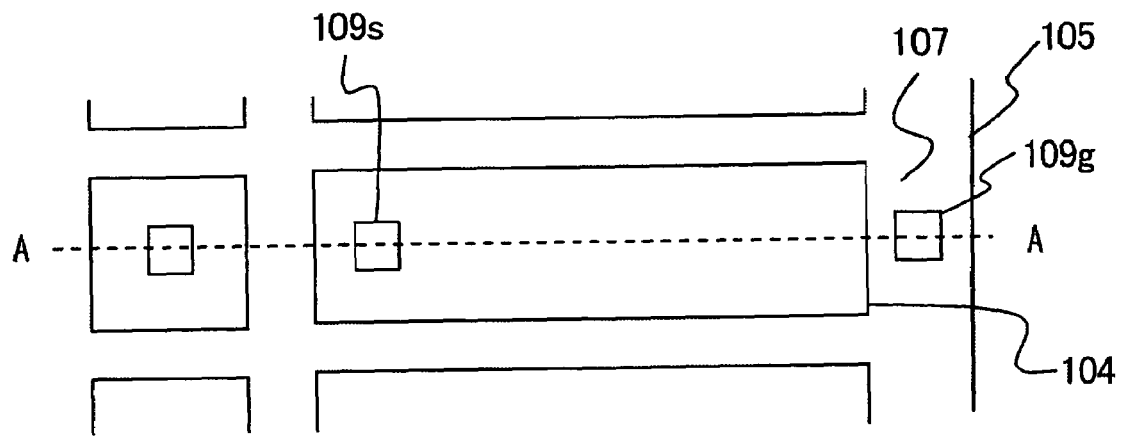
FIG. 1A is a top view showing a semiconductor device according to the embodiment of the present invention.

A preferred embodiment of the present invention is described hereinafter with reference to the drawings. FIG. 1A is a top view showing a semiconductor device of an embodiment of the invention, and FIG. 1B is a sectional view along line A-A of FIG. 1A.

Figure 1B:
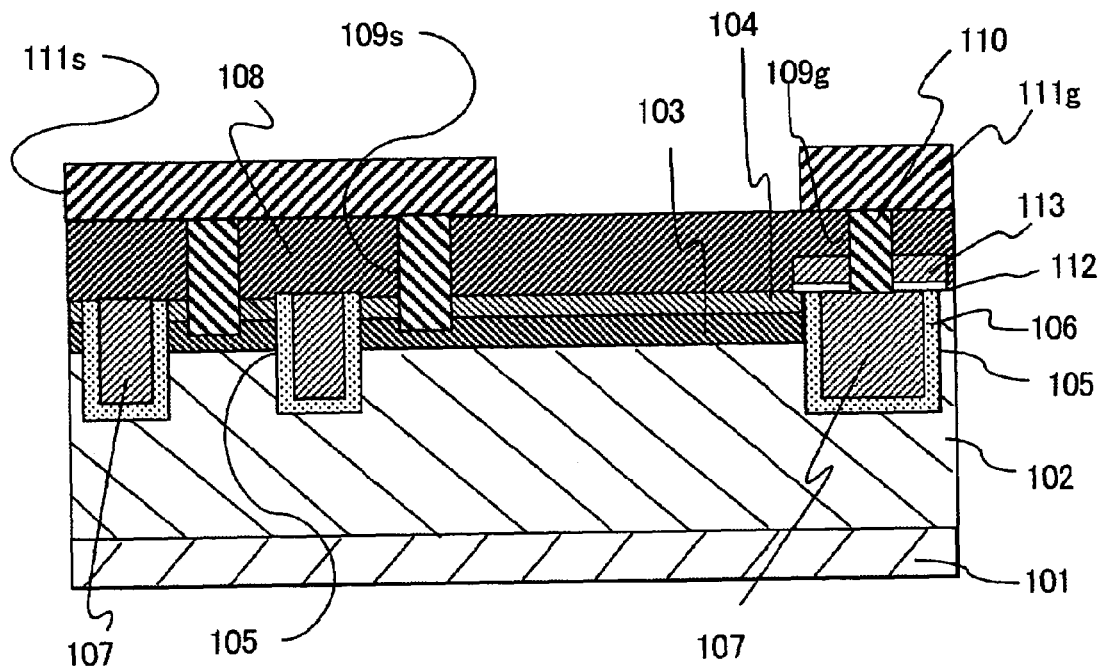
FIG. 1B is a sectional view showing a semiconductor device of the embodiment of the present invention.

A semiconductor substrate 101 shown in FIG. 1B is an n+ type semiconductor substrate that is formed of silicon, for example. An epitaxial layer 102 is formed all over the semiconductor substrate 101. The epitaxial layer 102 is an n− type semiconductor layer, for example, which serves as a drain of a vertical MOSFET together with the semiconductor substrate 101. Formed on the epitaxial layer 102 is a base region 103. The base region 103 is a p type semiconductor region containing boron, for example, where a channel is formed in the vicinity of a gate electrode 107 during operation of the vertical MOSFET. A source region 104 is formed all over the base region 103. The source region 104 is an n+ type semiconductor region containing arsenic, for example, which serves as a source of the MOSFET. Further, a trench 105 that reaches a position deeper than the source region 104 and the base region 103 is formed above the semiconductor substrate 101. Inside the trench 105, a gate insulation film 106 is formed to cover the inner surface of the trench 105. Also formed inside the trench 105 is the gate electrode 107. The gate electrode 107 is formed of a first polysilicon layer, for example, and substantially fills the inside of the trench 105 to an opening.

The trench 105 is formed in a substantially rectangular shape to surround the base region 103 and the source region 104, thus creating an island-shaped active region. The semiconductor device of this embodiment has a plurality of island-shaped active regions arranged as shown in FIG. 1A. Further, a field insulation film is selectively formed on the epitaxial layer 102 to separate elements, though not shown.

A second insulation film 112 and a second conductive film 113 are successively formed above a given gate electrode 107 of a plurality of gate electrodes 107 that are formed above the semiconductor substrate 101 so as to cover the opening of the trench 105. The second insulation film 112 is formed in a different process from the gate insulation film 106, and the second conductive film 113 is formed in a different process from the gate electrode 107. The second insulation film 112 is formed of a second silicon oxide film, and the second conductive film 113 is formed of a second polysilicon film, for example.

Further, an interlayer insulation film 108 is formed all over the semiconductor substrate 101 including the source region 104 and the second conductive film 113. The interlayer insulation film 108 is formed of boron-doped phosphosilicate glass (BPSG), for example.

As shown in FIG. 1B, the interlayer insulation film 108 has a plurality of contact holes 109. The following description refers to the contact holes as a first contact hole 109g and a second contact hole 109s based on their positions. The first contact hole 109g is formed above the gate electrode 107. The first contact hole 109g penetrates through the interlayer insulation film 108, the second conductive film 113, and the second insulation film 112. The first contact hole 109g is created to expose the top surface of the gate electrode 107.

The second contact hole 109s is formed in the upper part of the source region 104. The second contact hole 109s penetrates through the interlayer insulation film 108 and the source region 104. The second contact hole 109s is created so that its bottom reaches the base region 103.

The second insulation film 112 and the second conductive film 113 are formed above the trench 105 where the first contact hole 109g is formed on the gate electrode 107 (see FIG. 1B). Thus, if the first contact hole 109g is not formed above the trench 105, there is no need to form the second insulation film 112 and the second conductive film 113.

The first contact hole 109g and the second contact hole 109s are each filled with a conductive plug 110 that is formed of a conductor such as tungsten and titanium. The conductive plug 110 is formed in contact with the gate electrode 107 and the base region 103.

Further, a line 111 is formed on the conductive plug 110 and the interlayer insulation film 108. The line 111 is formed by patterning a conductive layer such as an aluminum layer into a predetermined shape. The line 111 forms a gate line 111g that is connected to the gate of the vertical MOSFET and a source line 111s that is connected to the source of the vertical MOSFET.

The gate line 111g is electrically connected to the gate electrode 107 by the conductive plug 110 that is formed inside the first contact hole 109g. The source line 111s is electrically connected to the base region 103 and the source region 104 by the conductive plug 110 that is formed inside the first contact hole 109s.

A method of manufacturing a semiconductor device having the above-described structure is described hereinafter with reference to FIGS. 2 to 5. FIGS. 2 to 5 show a part of a protection zener diode or a resistor that is formed on an element separating film or the like by using the second conductive film.

First, the n− type semiconductor epitaxial layer 102 is epitaxially grown on the whole surface of the n+ semiconductor substrate 101. Then, an element separating film (field insulation film) 114 is formed by local oxidation of silicon (LOCOS) process, for example.

After that, the epitaxial layer 102 is selectively removed by photolithography and reactive ion etching (RIE). The epitaxial layer 102 thereby has the trench 105 with a depth of approximately 1 to 2 μm to form a gate electrode in a lattice.

An oxide film is formed inside the trench at about 1100° C. to 1200° C. and then removed, thereby rounding a flection of the trench, though not shown.

Then, the gate insulation film 106 of approximately 30 nm is formed on the surface of the epitaxial layer 102. The gate insulation film 106 is formed by oxidizing the surface of the epitaxial layer 102 in atmosphere of $H_2$—$O_2$, for example. Thus, the gate insulation film 106 is a gate oxide film in this embodiment.

After that, a first conductive layer is deposited all over the semiconductor substrate 101 by low-pressure CVD, for example, though not shown. This embodiment deposits a first polysilicon layer as the first conductive layer. The thickness of the first polysilicon layer is such that the polysilicon fills the entire inside of the trench 105. The thickness of the polysilicon layer is approximately 800 nm to 1000 nm in this example.

Figure 2:
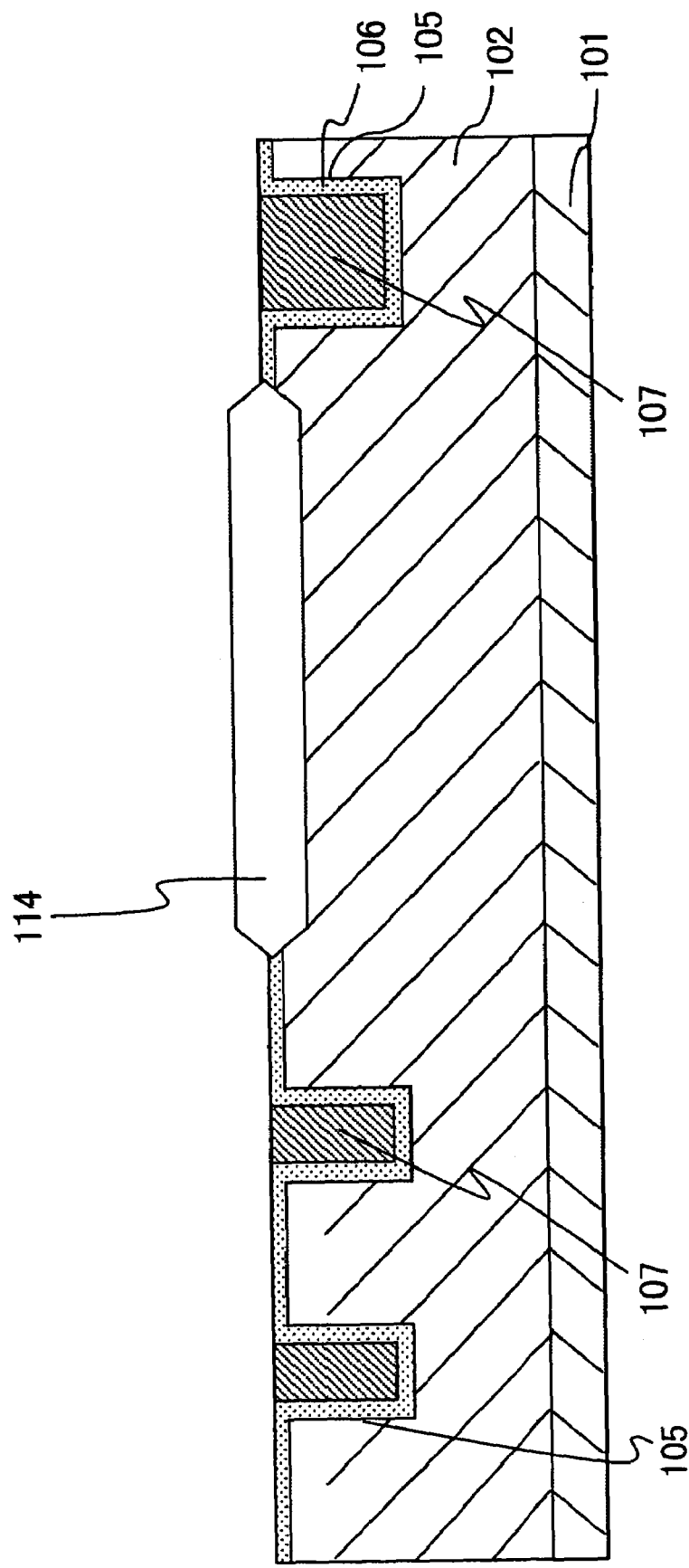
FIG. 2 is a sectional view showing a manufacturing method according to the embodiment of the present invention.

Then, the first polysilicon layer is etched back by RIE to remove unnecessary parts. The polysilicon layer is thereby selectively left only inside the trench 105. Thus, the gate insulation film 106 and the gate electrode 107 are formed inside the trench 105 as shown in FIG. 2.

Then, ion implantation of p-type impurity such as boron (B) and heat treatment are performed successively on the semiconductor substrate 101. The conditions of the ion implantation using boron are: dose amount of $1*10^{13}/cm^2$ to $2*10^{13}/cm^2$ and accelerating voltage of 70 keV, for example. The heat treatment is performed for 60 minutes in $N_2$ atmosphere at the temperature of 900° C. to 1000° C., for example. In this process, a p-type diffusion layer 103 is formed above the epitaxial layer 102.

Further, ion implantation of n-type impurity such as arsenic (As) and heat treatment are performed successively on the base region 103. The conditions of the ion implantation using arsenic are: dose amount of $1*10^{15}/cm^2$ to $5*10^{15}/cm^2$ and accelerating voltage of 70 keV, for example. The heat treatment is performed for 30 minutes in $N_2$ atmosphere at the temperature of 850 to 950° C., for example. By this process, the surface region of the base region 103 becomes n-type. The source region 104 formed of an n+ type diffusion layer is thereby formed on the surface of the base region 103.

The manufacturing method of this embodiment forms the second insulation film 112 and the second conductive film 113 after forming the base region 103 and the source region 104.

It is preferred to form the second insulation film 112 and the second conductive film 113 in the process of forming another part of the semiconductor device. For example, when manufacturing the power device using the vertical MOSFET, a gate-source protection zener diode, a drain-source voltage clamp zener diode, a gate protection resistor and so on are sometimes formed in another region of the same substrate together with the power MOSFET. These devices are often formed of a polysilicon film that is deposited on the element separating film, for example, and therefore a process of forming the polysilicon film is often required when manufacturing the power MOSFET.

Thus, this embodiment uses an oxide film and a polysilicon film on the element separating film that are used when forming a zener diode to form the second insulation film 112 and the second conductive film 113. When forming the zener diode, the oxide film and the polysilicon film are formed all over the semiconductor substrate 101, though not shown.

Figure 3:
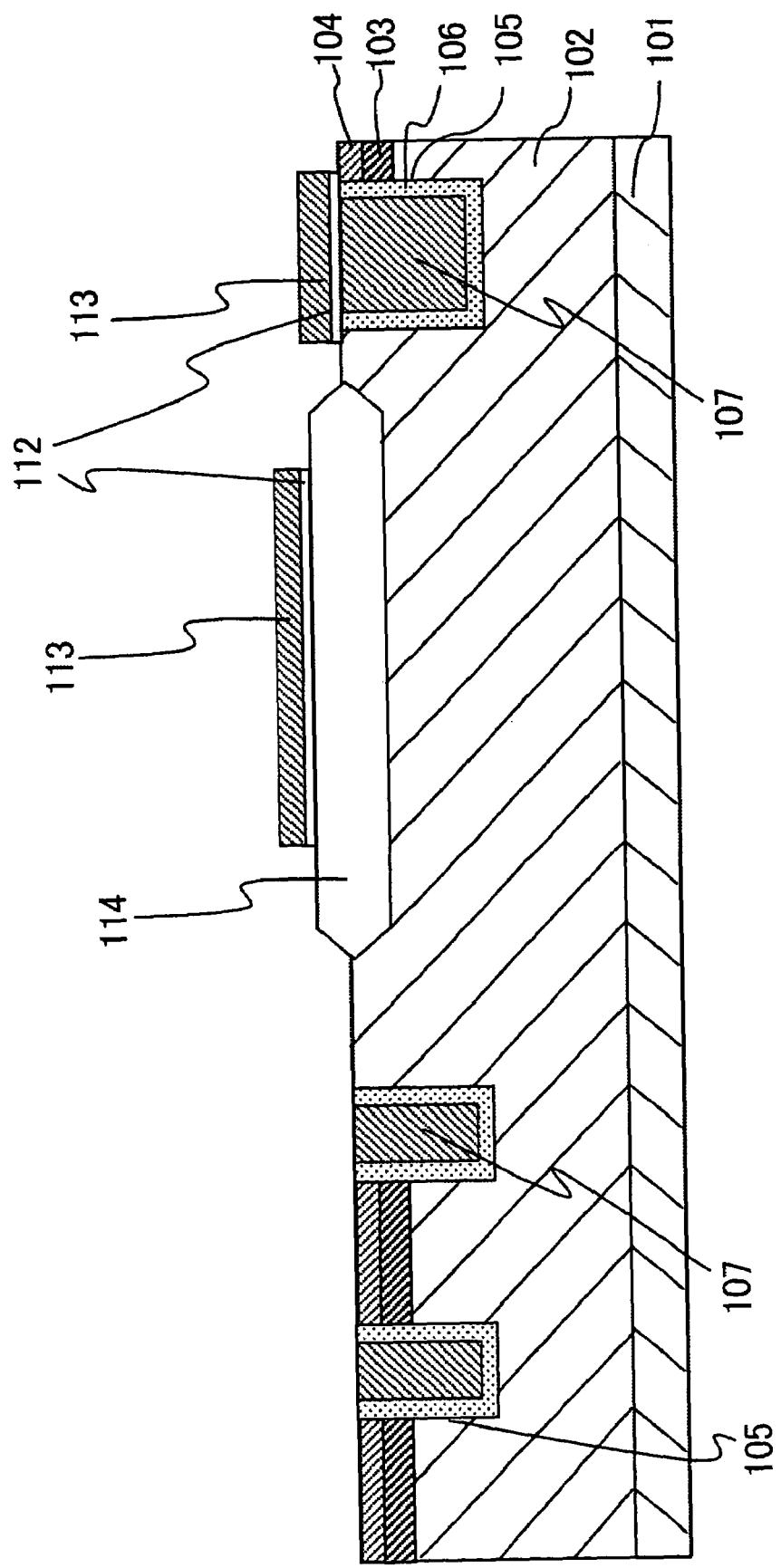
FIG. 3 is a sectional view showing a manufacturing method according to the embodiment of the present invention.

After that, the polysilicon 113 is etched into a predetermined pattern to form a zener diode (see FIG. 3). This etching is performed so that the oxide film and the polysilicon film are left also above a predetermined gate electrode 107 as the second insulation film 112 and the second conductive film 113. The polysilicon film is thereby formed above the trench 105 where the first contact hole 109g is formed on the gate electrode 107. Therefore, at the same time as forming the oxide film and the polysilicon film (second conductive film 113) of the zener diode, the second insulation film 112 and the second conductive film 113 are formed on the predetermined gate electrode 107 in the MOSFET region.

The second conductive film (polysilicon film) that is formed in this process may have a size that covers the opening of the trench 105. FIG. 3 shows the state where the second conductive film such as a zener diode is formed on the element separating film 114 and the second insulation film 112 and the second conductive film 113 are formed above the trench.

Figure 4:
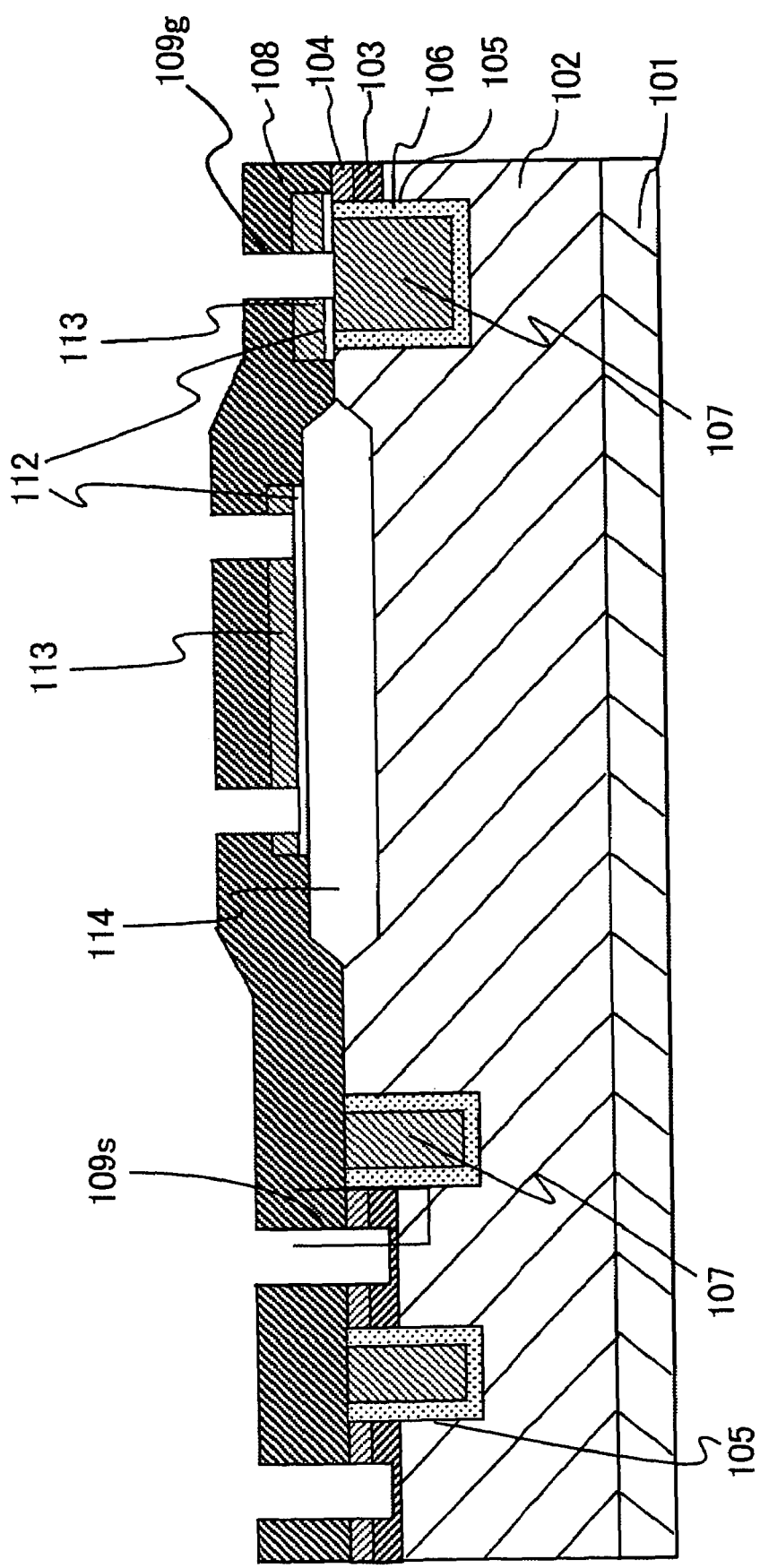
FIG. 4 is a sectional view showing a manufacturing method according to the embodiment of the present invention.

Then, a BPSG layer is deposited all over the semiconductor substrate 101 by atmospheric pressure CVD, thereby forming the interlayer insulation film 108 as shown in FIG. 4. After that, the interlayer insulation film 108 is selectively removed by photolithography and RIE. This etching removes the part of the interlayer insulation film 108 which corresponds to the first and second contact holes 109g and 109s.

As described earlier, the first contact hole 109g is formed above the gate electrode 107 so as to penetrate the second conductive layer 113. The second contact hole 109s is formed in the base region 103 so as to penetrate the source region 104. Thus, when forming the contact holes 109, the interlayer insulation film 108 is selectively etched away. It is then needed to etch away the source region 104 in the part corresponding to the second contact hole 109s. Therefore, the etching of the interlayer insulation film 108 is followed by the silicon etching of the source region 104.

At this time, in the region corresponding to the first contact hole 109g, the second conductive film 113 is etched. Since the polysilicon film 113 is etched while the source region 104 is etched, the gate electrode 107 is not etched. Further, even after the polysilicon film 113 is etched away, the second insulation film 112 remains therebelow. The second insulation film 112 serves as an etching stopper, thereby preventing a short-circuit between the gate and drain (or source) that can occur when the gate electrode is etched away.

The second insulation film 112 can be removed by silicon etching depending on its thickness. In this case, it is possible to proceed to a next process of forming a conductive plug. Even if the second insulation film 112 is left on the gate electrode 107, it can be removed easily by wet etching or the like.

FIG. 4 shows the state where the contact holes 109 are formed in the above way. The surface of the gate electrode 107 is exposed through the first contact hole 109g, and the base region 103 is exposed through the second contact hole 109s. Further, the presence of the second insulation film 112 and the second conductive film 113 prevents the gate electrode 107 from being etched when etching the source region 104.

After that, a barrier metal such as Ti and TiN is fomred by sputtering, and a tungsten layer, for example, is deposited all over the semiconductor substrate 101 by low-pressure CVD, though not shown. The thickness of the tungsten layer is such that the tungsten layer fills the entire inside of the contact hole 109.

Figure 5:
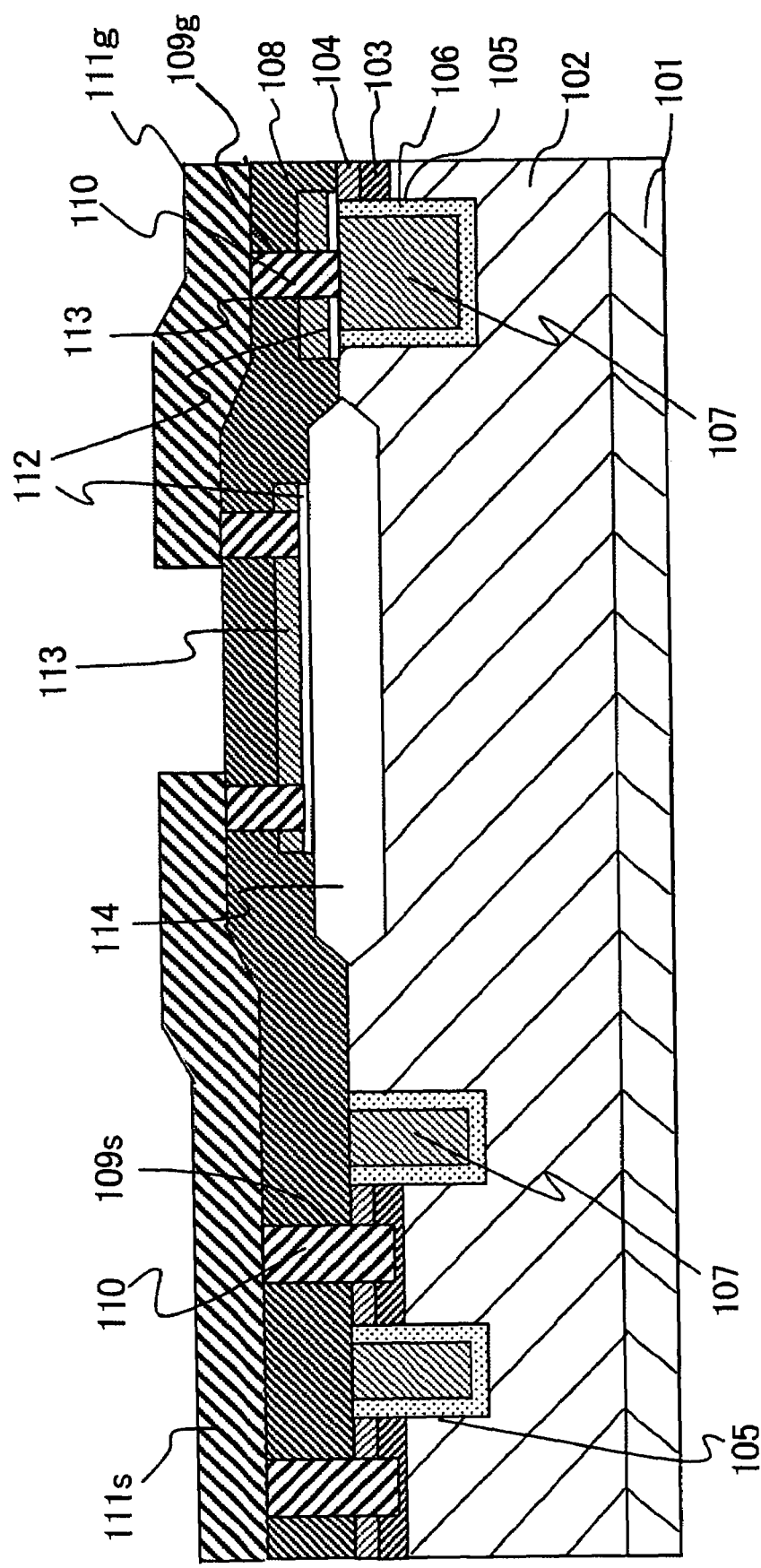
FIG. 5 is a sectional view showing a manufacturing method according to the embodiment of the present invention.
Figure 6:
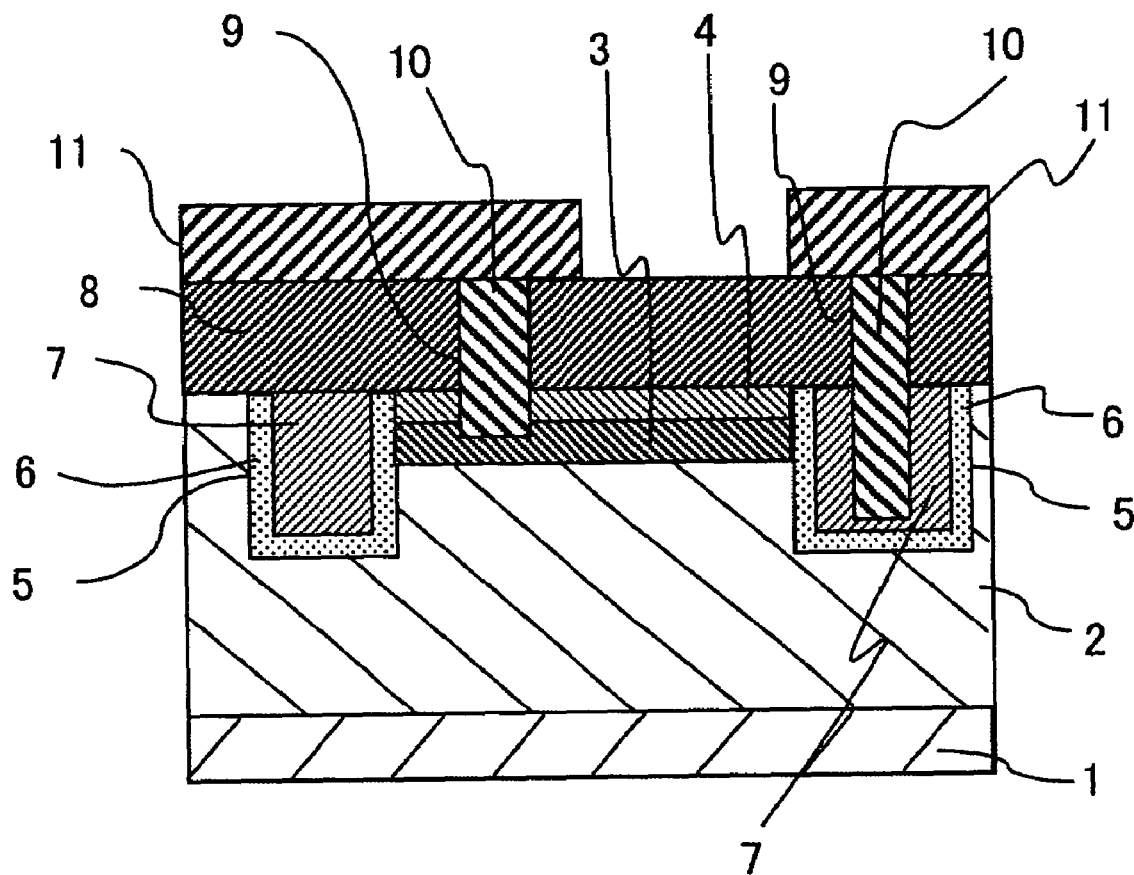
FIG. 6 is a sectional view showing a conventional semiconductor device.

Further, the tungsten layer is etched back by entire etching with RIE to remove unnecessary parts. The tungsten layer is thus selectively left only inside the contact hole 109. The conductive plug 110 that fills the inside of the contact hole 109 is thereby formed as shown in FIG. 5.

Then, a conductive layer is formed all over the semiconductor substrate 101 by sputtering aluminum or the like, though not shown. The conductive layer is patterned by photolithography and etching to form the source line 111s and the gate line 111g. The above series of processes produce the semiconductor device 1 shown in FIG. 1B.

As described above, the semiconductor device of this embodiment has the second insulation film 112 and the second conductive film 113 on the gate electrode 107. When manufacturing a conventional semiconductor device, silicon etching is performed to form the contact hole 109s that penetrates the source region 104 to reach the base region 103 after removing the interlayer insulating film 108. The polysilicon of the gate electrode is exposed during the silicon etching, and therefore the gate electrode is etched in the conventional semiconductor device. The etching of the gate electrode can cause a short-circuit between the gate and drain. In this embodiment, on the other hand, the first polysilicon that serves as the gate electrode 107 is left without being etched after the silicon etching to form the second contact hole 109s, thus preventing a short-circuit between the gate and drain.

Though the embodiment of the present invention is detailed in the foregoing, the present invention is not limited thereto but may be altered in various ways. For example, the polysilicon film that is deposited on the gate electrode 107 where the contact hole 109g is formed is a polysilicon film that is used for the formation of a zener diode in the above embodiment. It is, however, only required to form the second conductive film having the thickness that prevents etching of the gate electrode 107 during etching of the source region 104 in this invention. It is therefore feasible to perform a separate process of forming the second conductive film after forming the source region 104.

Further, though the above embodiment describes the case of using the N-type MOS transistor, it is possible to form the second conductive film when using a P-type MOS transistor as well. The present invention is also applicable to the semiconductor device where the gate electrode is filled into another trench such as IGBT (Insulated Gate Bipolar Transistor) as long as a contact is formed above the gate electrode.

It is apparent that the present invention is not limited to the above embodiment that may be modified and changed without departing from the scope and spirit of the invention.

What is claimed is:

1. A semiconductor device comprising:
   a base region formed above a semiconductor substrate;
   a source region formed above the base region;
   a gate electrode formed inside a trench formed above the semiconductor substrate;
   an interlayer insulation film formed over the source region and the gate electrode;
   a conductive film between the interlayer insulation film and the gate electrode;

a first contact hole extending through the interlayer insulation film and the conductive film to expose the gate electrode;

a second contact hole extending through the interlayer insulation film and the source region to expose the base region.

2. The semiconductor device according to claim 1, further comprising:

an insulation film formed between the conductive film and the gate electrode.

3. The semiconductor device according to claim 1, wherein the conductive film is formed of a polysilicon film.

4. A method of manufacturing a semiconductor device, comprising:

forming a trench above a semiconductor substrate;
forming a gate electrode inside the trench;
forming a base region above the semiconductor substrate;
forming a source region above the base region;
forming a conductive film above the gate electrode;
forming an interlayer insulation film over the source region and the conductive film;
forming a first contact hole to the base region by etching the interlayer insulation film and the source region; and
forming a second contact hole to the gate electrode by etching the interlayer insulation film and the conductive film.

5. The method of manufacturing a semiconductor device according to claim 4, wherein the conductive film is a polysilicon film used for a diode or a resistor to be formed above an element separating film.

6. The method of manufacturing a semiconductor device according to claim 4, wherein etching of the source region and the conductive film is silicon etching.

7. The method of manufacturing a semiconductor device according to claim 6, wherein the conductive film is a polysilicon film used for a diode or a resistor to be formed above an element separating film.

* * * * *